United States Patent [19]
Shimura

[11] Patent Number: 6,051,889
[45] Date of Patent: *Apr. 18, 2000

[54] SEMICONDUCTOR DEVICE HAVING A FLIP-CHIP STRUCTURE

[75] Inventor: Tadayuki Shimura, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/105,006

[22] Filed: Jun. 26, 1998

[30] Foreign Application Priority Data

Dec. 2, 1997 [JP] Japan ................................ 9-331980

[51] Int. Cl.⁷ .................................................. H01L 23/48
[52] U.S. Cl. .......................... 257/778; 257/776; 257/775; 257/618; 257/619; 257/622; 257/623; 361/760
[58] Field of Search ..................................... 257/778, 776, 257/780, 786, 618, 619, 622, 623, 758, 775, 777, 773; 361/794, 775, 753, 760

[56] References Cited

U.S. PATENT DOCUMENTS 5,510,758  4/1996  Fujita et al. ............................. 257/778
5,744,857  4/1998  Yamamoto ............................... 257/622

Primary Examiner—Tom Thomas
Assistant Examiner—Luan Thai
Attorney, Agent, or Firm—Armstrong, Westerman, Hattori, McLeland and Naughton

[57] ABSTRACT

A semiconductor device includes a substrate having a first principal surface carrying thereon a first wiring pattern and a semiconductor chip having a second principal surface carrying a second wiring pattern thereon. The semiconductor chip is disposed on the substrate such that said second principal surface faces the first principal surface and a conductor is used for connecting the first wiring pattern and the second wiring pattern electrically and mechanically. The second wiring pattern includes a power conductor pattern, wherein a distance between the first principal surface and the second principal surface is increased selectively in correspondence to a part of the second principal surface on which the power conductor pattern is provided.

7 Claims, 6 Drawing Sheets

6,051,889

SEMICONDUCTOR DEVICE HAVING A FLIP-CHIP STRUCTURE

BACKGROUND OF THE INVENTION

The present invention generally relates to semiconductor devices and more particularly to a semiconductor device having a flip-chip structure.

The art of flip-chip mounting is used extensively in the semiconductor devices for use in high-frequency applications such as radio telecommunication systems including portable telephones or automotive radar systems that use a millimeter band.

In a flip-chip structure, a semiconductor chip carrying thereon an electrode pad is mounted on a mount substrate in a turned-over state such that the electrode pad on the semiconductor chip achieves a contact with a corresponding wiring pattern provided on the mount substrate by a solder bump. As the electrode pad on the semiconductor chip contacts the wiring pattern on the mount substrate directly in such a flip-chip structure, the problem of parasitic inductance, which occurs in the case where the semiconductor chip is mounted by an ordinary wire bonding process, is effectively and successfully eliminated.

FIG. 1 shows the construction of a conventional semiconductor device 10 having a typical flip-chip structure.

Referring to FIG. 1, the semiconductor device 10 is formed of a mount substrate 1 carrying thereon a wiring pattern 1A and a semiconductor chip 2 mounted on the mounting substrate 1, and the semiconductor chip 2 carries, on a principal surface thereof, a wiring pattern 2A that includes electrode pads. The semiconductor chip 2 is mounted on the mount substrate 1 in a turned-over state such that the foregoing principal surface faces the mount substrate 1. Thereby, the wiring pattern 2A on the chip 2 is connected to the corresponding wiring pattern 1A on the mount substrate 1 electrically as well as mechanically by a solder bump 3.

In such a semiconductor device having a flip-chip structure, the distance between the mount substrate 1 and the semiconductor chip 2 is determined such that the wiring patterns 1A and 2A have a predetermined optimum impedance, which may be set to 50 Ω, for facilitating the signal transmission via the wiring patterns 1A and 2A. Similarly, the width of the patterns 1A and 2A are set to respective predetermined widths.

In such conventional flip-chip semiconductor devices, however, there has been a problem, associated with the fact that both the signal conductor pattern and the power conductor pattern in the wiring pattern 1A or 2A have the same impedance of 50 Ω, in that the high-frequency signal on the signal conductor pattern tends to leak to the power conductor pattern. While this problem may be overcome by merely increasing the impedance thereof by reducing the width of the power conductor pattern, such an approach is not preferable because it decreases the electric current to be supplied by such a power conductor pattern.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a flip-chip structure in which the impedance of the wiring patterns therein can be adjusted by a simple construction.

Another object of the present invention is to provide a semiconductor device having a flip-chip structure wherein the impedance of the wiring pattern used therein for supplying an electric power is set higher than the impedance of the wiring pattern used for carrying electrical signals.

Another object of the present invention is to provide a semiconductor device, comprising:

a substrate having a first principal surface, said substrate carrying first wiring patterns on said first principal surface;

a semiconductor chip having a second principal surface, said semiconductor chip carrying second wiring patterns on said second principal surface, said semiconductor chip being disposed on said substrate such that said second principal surface faces said first principal surface; and a conductor connecting one of said first wiring patterns and one of said second wiring patterns electrically and mechanically;

said second wiring pattern including a power conductor pattern;

wherein a distance between said first principal surface and said power conductor pattern is larger than a length of said conductor in an area in correspondence to said power wiring pattern where said power wiring pattern is not electrically connected to said first principle surface.

According to the present invention, the impedance of the power conductor pattern can be increased with respect to a signal conductor pattern on the semiconductor chip, by providing a depression on one of the first principal surface of the substrate and the second principal surface of the semiconductor chip selectively in correspondence to the power conductor pattern. As a result of the increased impedance of the power conductor pattern, the leakage of the signals to the power conductor pattern from a signal conductor pattern is effectively suppressed. As there is no need to reduce the width of the power conductor pattern for achieving the desired increase of the impedance, there occurs no increase of resistance in the power conductor pattern.

Other objects and further features of the present invention will become apparent from the following detailed description when read in conjunction with the attached drawings.

DETAILED DESCRIPTION OF THE PREFERRED EMBODIMENT

PRINCIPLE

Figure 1:
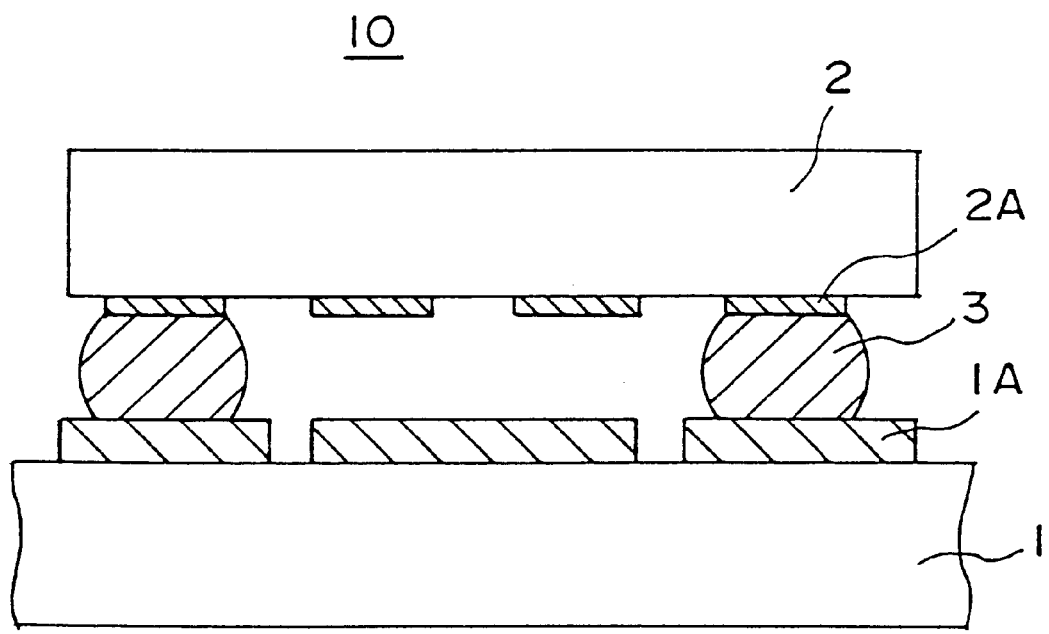
FIG. 1 is a diagram showing the construction of a conventional semiconductor device having a flip-chip structure.
Figure 2:
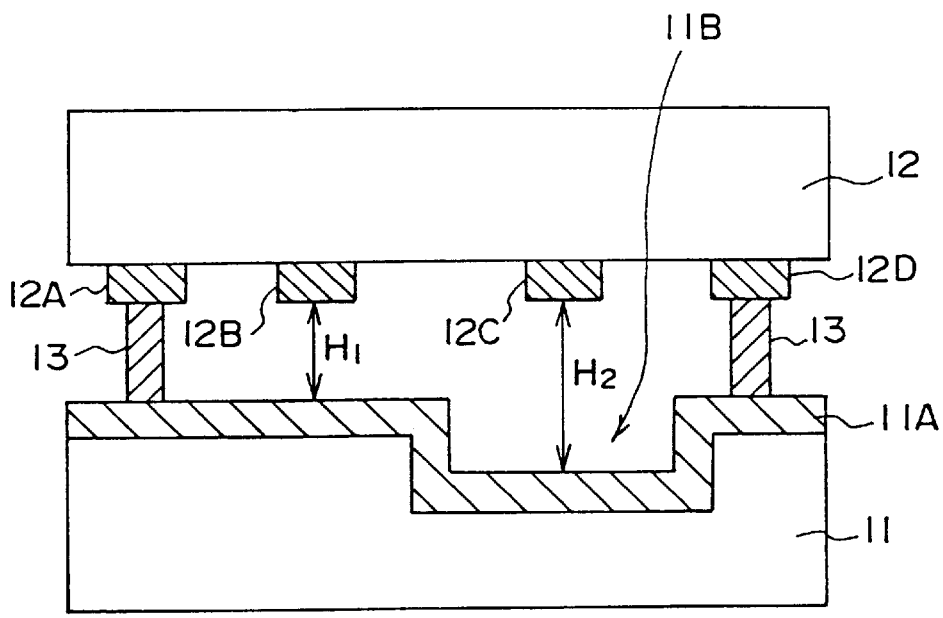
FIG. 2 is a diagram showing the principle of the present invention.

FIG. 2 shows the principle of the semiconductor device of the present invention.

Referring to FIG. 2, the semiconductor device includes a mount substrate 11 carrying thereon a ground pattern 11A wherein the ground pattern 11A covers the surface of the mount substrate 11A more or less uniformly. Further, a semiconductor chip 12 carrying electrode pads 12A–12D on a principal surface thereof is mounted on the mount substrate 11 such that the foregoing principal surface of the semiconductor chip 12 faces the top principal surface of the mount substrate 11. Thereby, the semiconductor chip 12 is connected to the mount substrate 11 by means of a solder bump 13.

In the construction of FIG. 2, it should be noted that the electrode pads 12A and 12D are ground electrode pads and are connected to the ground pattern 11A on the substrate 11 by the solder bump 13. On the other hand, the electrode pads 12B and 12C form a part of the signal conductor patterns that are provided also on the semiconductor chip 12. Thereby, it can be seen that the signal conductor pattern 12B faces the ground pattern 11A on the substrate 11 with a predetermined distance $H_1$ therebetween to form a microstrip line, wherein the foregoing predetermined distance $H_1$ may be set to about 15 μm such that the signal conductor pattern 12B has an impedance of about 50 Ω.

Further, it should be noted, in the semiconductor device of FIG. 2, that the substrate 11 is formed with a depression 11B on the principal surface thereof in correspondence to the electrode pad 12C which forms a part of the power conductor pattern on the semiconductor chip 12, wherein the depression 11B is covered by the ground pattern 11A continuously to other part of the substrate 11. It should be noted that the distance $H_2$ between the power conductor pattern 12C and the ground pattern 11B on the depression 11B is increased with respect to the distance $H_1$ and the power conductor pattern 12C has an increased impedance as compared with the signal conductor pattern 12B.

Figure 3:
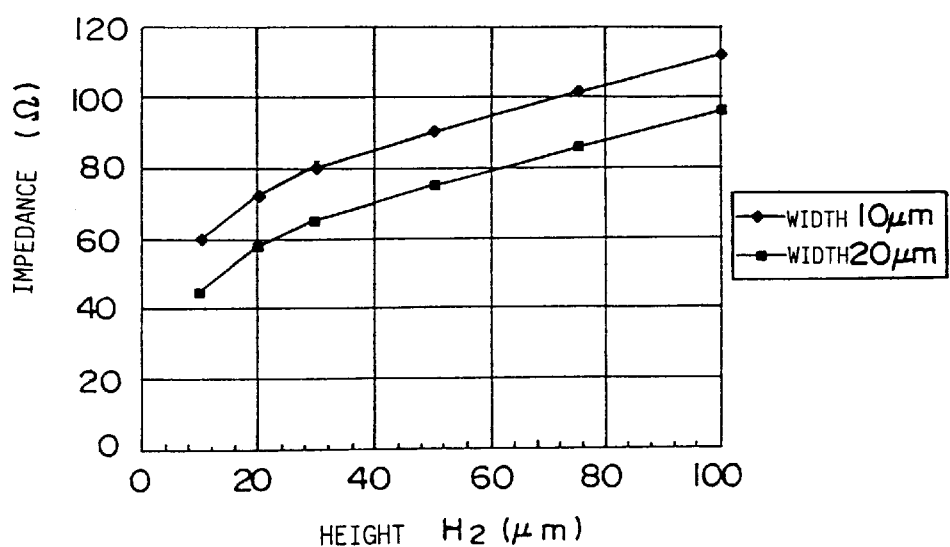
FIG. 3 is another diagram showing the principle of the present invention.

FIG. 3 shows an example of the calculated impedance for the power conductor pattern 12C for the case of in which the power conductor pattern 12C has a width of 10 μm and for the case in which the power conductor pattern 12C has a width of 20 μm, while changing the distance $H_2$ variously.

Referring to FIG. 3, it can be seen that the power conductor pattern 12C has a larger impedance when the pattern width is 10 μm than in the case when the pattern width is 20 μm, as is expected. In both cases, it is noted further that the impedance of the power conductor pattern 12C increases with increasing distance $H_2$ and reaches a value of 100 Ω or more when the distance $H_2$ is increased to 100 μm or more.

FIRST EMBODIMENT

Figure 4A:
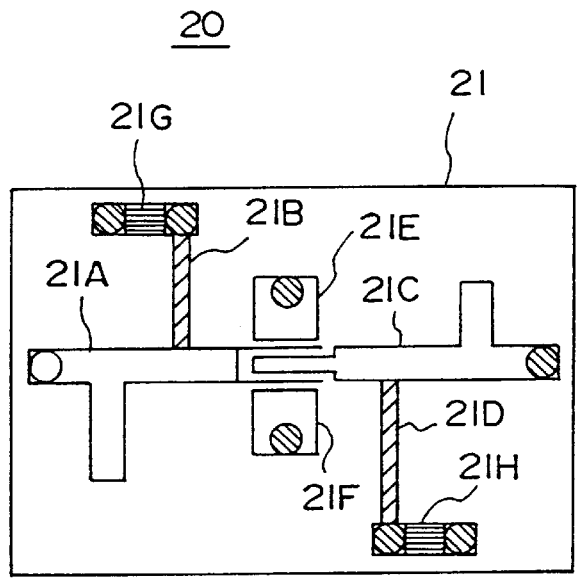
FIGS. 4A and 4B are diagrams showing the construction of a semiconductor device having a flip-chip structure according to a first embodiment of the present invention.
Figure 4B:
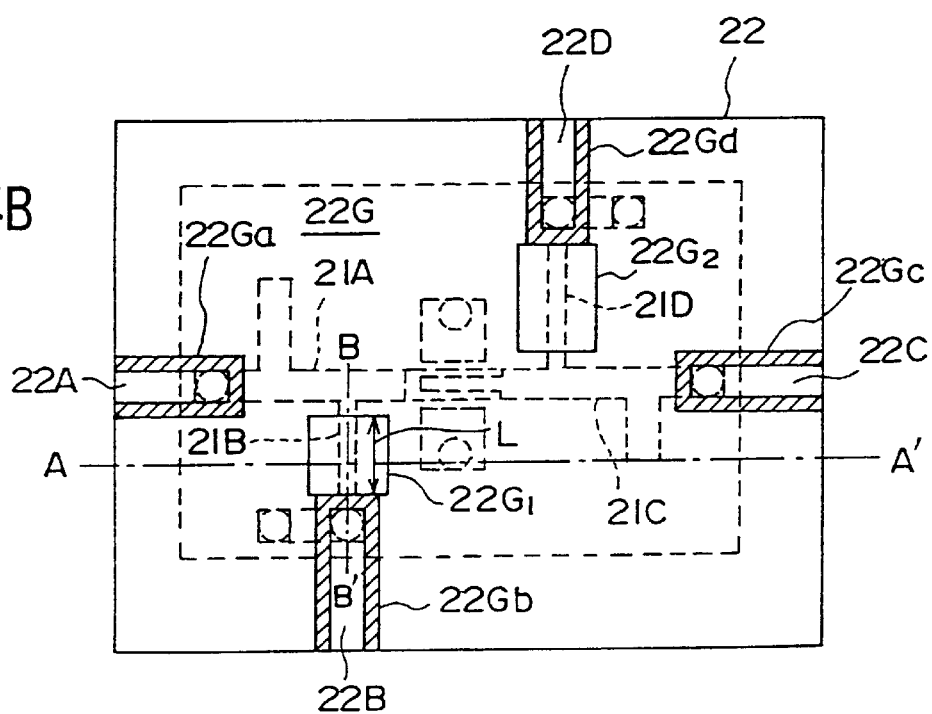

FIGS. 4A and 4B are diagrams showing a semiconductor device 20 according to a first embodiment of the present invention, wherein FIG. 4A shows a wiring pattern provided on a bottom principal surface of a semiconductor chip 21 forming a part of the semiconductor device 20 together with a substrate 22, while FIG. 4B shows a wiring pattern that is provided on a top principal surface of the substrate 22 in correspondence to the wiring pattern of FIG. 4A.

Referring to FIG. 4A, it can be seen that the bottom principal surface of the semiconductor chip 21 carries thereon an input signal conductor pattern 21A connected commonly to respective gate electrodes of the FETs that are formed on the semiconductor chip 21 in a series connection, a first power conductor pattern 21B connected to the input signal conductor pattern 21A for biasing the same with a supply voltage, an output signal conductor pattern 21C connected commonly to respective drain electrodes of the FETs for carrying an output signal, and a second power conductor pattern 21D connected to the output signal conductor pattern 21C for supplying thereto the supply voltage. Further, there are provided source electrode patterns 21E and 21F on the bottom principal surface of the semiconductor chip 21 in correspondence to the FETs. It should be noted that each of the first and second power conductor patterns 21B and 21D are grounded to a ground terminal via protective elements 21G and 21H each including a diode or a resistor.

On the other hand, the top principal surface of the substrate 22 is covered more or less uniformly by a ground pattern 22G except for cutouts 22Ga–22Gd, wherein it should be noted that the cutout 22Ga includes therein a signal conductor pattern 22A in correspondence to the signal conductor pattern 21A on the semiconductor chip 21 and that the cutout 22Gb includes therein a power conductor pattern 22B in correspondence to the power conductor pattern 21B on the semiconductor chip 22. Further, the cutout 22Gc includes therein a signal conductor pattern 22C in correspondence to the output signal conductor pattern 21C and the cutout 22Gd includes therein a power conductor pattern 22D in correspondence to the power conductor pattern 21D on the semiconductor chip 21. In FIG. 4B, it should be noted that the patterns on the chip 21 are indicated by the broken lines.

Figure 5:
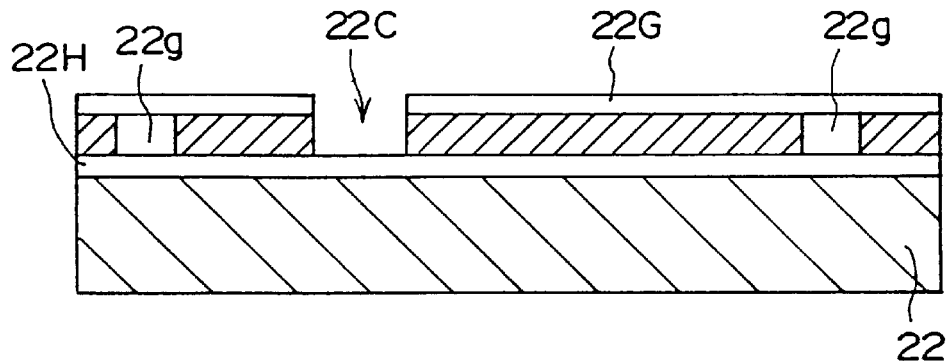
FIG. 5 is a diagram showing a part of the semiconductor device of the first embodiment in a cross-sectional view.

FIG. 5 shows the substrate 22 of FIG. 4B in a cross-sectional view taken along a line A–A'.

Referring to FIG. 5, it can be seen that the substrate 22 includes, in addition to the ground pattern 22G, another ground pattern 22H underneath the ground pattern 22G in a state that the ground patterns 22G and 22H are connected with each other electrically by a conductive plug 22g. Further, the substrate 22 includes a depression $22G_1$ in correspondence to the first power conductor pattern 21B of the semiconductor chip 21 wherein the depression $22G_1$ exposes the surface of the lower ground pattern 22H. Similarly, the substrate 22 is formed with a depression $22G_2$ in correspondence to the second power conductor pattern 21D of the semiconductor chip 21 such that the depression $22G_2$ exposes the surface of the lower ground pattern 22H.

In such a construction, it should be noted that the signal conductor pattern 21A or 21C faces the ground pattern 22G on the substrate 22 with a predetermined distance and there is formed a microstrip line having a predetermined impedance. On the other hand, the power conductor pattern 21B or 21D, which faces the lower ground pattern 22H with an increased mutual distance therebetween, shows an increased impedance. Thus, the problem of leakage of the high-frequency signals from the signal conductor pattern 21A or 21C to the power conductor pattern 21B or 21D and associated problem of interference caused by such leakage high-frequency signals are effectively eliminated.

Figure 6:
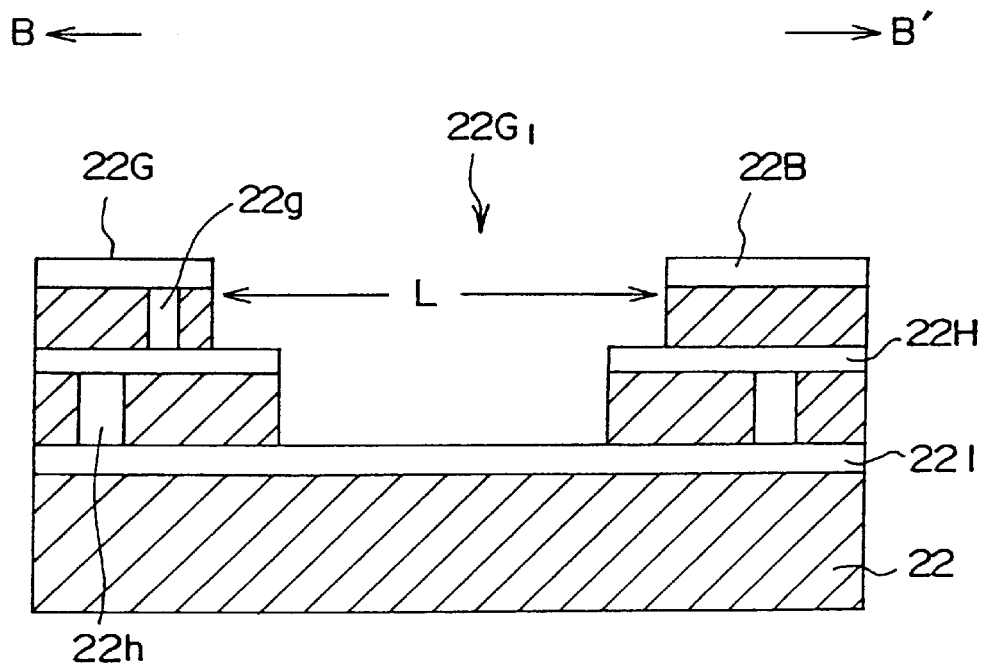
FIG. 6 is a diagram showing a modification of FIG. 5.

FIG. 6 shows a modification of the substrate 22 of FIG. 4B wherein FIG. 6 shows a cross-section of the substrate 22 taken along the line B–B' indicated in FIG. 4B.

Referring to FIG. 6, it can be seen that there is provided a further lower ground pattern 22I underneath the lower ground pattern 22H in electrical connection to the ground pattern 22H by a conductive plug 22h. Further, there is provided an opening in the depression $22G_1$ such that the opening exposes the ground pattern 22I. By forming the opening to have a reduced width as compared with a width L of the depression $22G_1$, it is possible to avoid a sudden change of impedance at the edge of the depression $22G_1$ and the problem of reflection of the signals associated with such a sudden change of the impedance is effectively eliminated.

It should be noted that the depression $22G_1$ or $22G_2$ is formed easily by a well established etching process.

Figure 7:
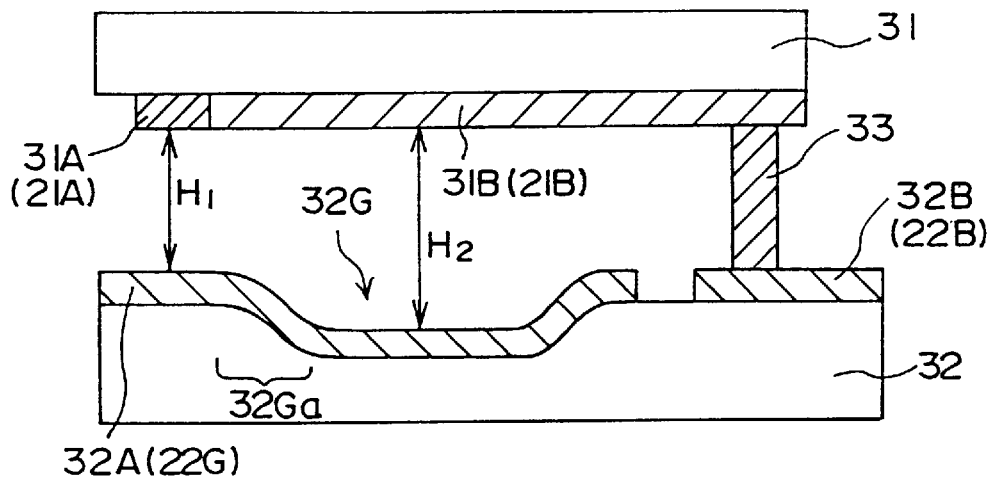
FIG. 7 is a diagram showing the construction of a semiconductor device having a flip-chip structure according to a second embodiment of the present invention.

FIG. 7 shows a flip-chip semiconductor device 30 according to a second embodiment of the present invention, wherein FIG. 7 also shows the cross-section taken along the line B–B' of FIG. 4B.

Referring to FIG. 7, the flip-chip semiconductor device 30 includes a semiconductor chip 31 that carries, on a bottom principal surface thereof, a signal conductor pattern 31A corresponding to the signal conductor pattern 21A of FIG. 4A and a power conductor pattern 31B corresponding to the power conductor pattern 21B of FIG. 4A in continuation to the signal conductor pattern 31A. Further, the semiconductor device 30 includes a substrate 32 carrying thereon the semiconductor chip 31, wherein the substrate 32 carries, on the top principal surface thereof, a ground pattern 32A in correspondence to the ground pattern 22G of FIG. 4B and a power conductor pattern 32B in correspondence to the power conductor pattern 22B of FIG. 4B. The semiconductor chip 31 is mounted on the substrate 32 such that the conductor patterns 31A and 31B face the corresponding conductor patterns 32A and 32B respectively, and the power conductor pattern 31B of the chip 31 is connected to the power conductor pattern 32B on the substrate 32 by a solder bump 33 electrically as well as mechanically.

In the construction of the present embodiment, the signal conductor pattern 31A carrying the high-frequency signal is held at the distance $H_1$ from the ground pattern 32A and forms a microstrip line having a predetermined impedance value such as 50 Ω.

On the other hand, it should be noted that the substrate 32 is formed with a depression or groove 32G in correspondence to the power conductor pattern 31B on the semiconductor chip 31, and the ground pattern 32A covers the surface of the groove 32G. Thus, the distance $H_2$ between the power conductor pattern 31B and the ground pattern 32A is increased as compared with the distance $H_1$ between the signal conductor pattern 31A and the ground pattern 32A outside the depression 32G. As a result of the increased distance $H_2$, the power conductor pattern 31B has an increased impedance.

In the present embodiment, it should be noted that the depression 32G is defined by a smooth side wall 32Ga. Thereby, the change of impedance at the depression 32G becomes smooth for the conductor pattern 31B extending on the chip 31 across the depression 32G and the problem of reflection of high-frequency signals on the conductor pattern 31B is effectively eliminated.

THIRD EMBODIMENT

Figure 8:
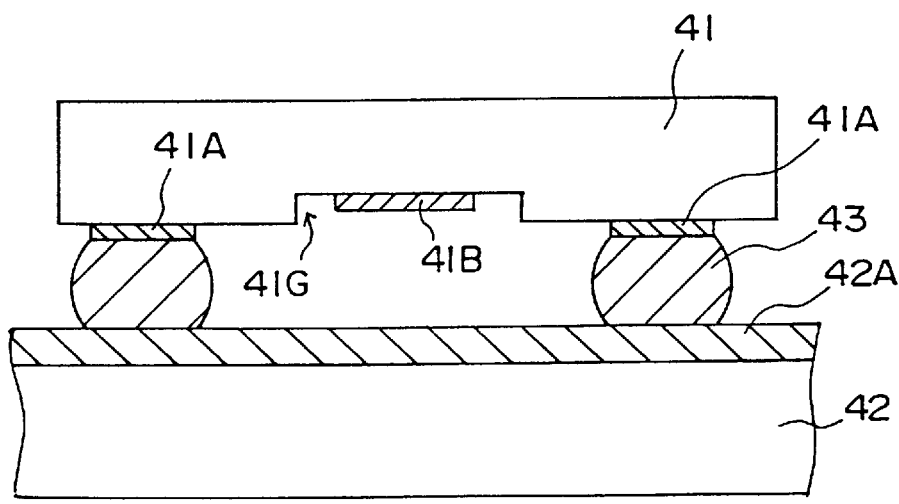
FIG. 8 is a diagram showing the construction of a semiconductor device having a flip-chip structure according to a third embodiment of the present invention.

FIG. 8 shows the construction of a flip-chip semiconductor device 40 according to a third embodiment of the present invention.

Referring to FIG. 8, the semiconductor device 40 includes a semiconductor chip 41 carrying a ground electrode 41A and a power conductor patter 41B on a bottom principal surface thereof in addition to signal conductor patterns not illustrated, wherein the semiconductor chip 41 is flip-chip mounted on a substrate 42 by a solder bump 43.

In the present embodiment, the substrate 42 has a flat top principal surface covered by a ground pattern 42A with a generally uniform thickness, while the bottom principal surface of the semiconductor chip 41 is formed with a depression or groove 41G in correspondence to the power conductor pattern 41B. The groove 41G accommodates therein the power conductor pattern 41B.

The construction of the present embodiment is also effective for increasing the impedance of the power conductor pattern 41B selectively for reducing the leakage of the high-frequency signal from the signal conductor pattern to the power conductor pattern 41B.

FOURTH EMBODIMENT

Figure 9:
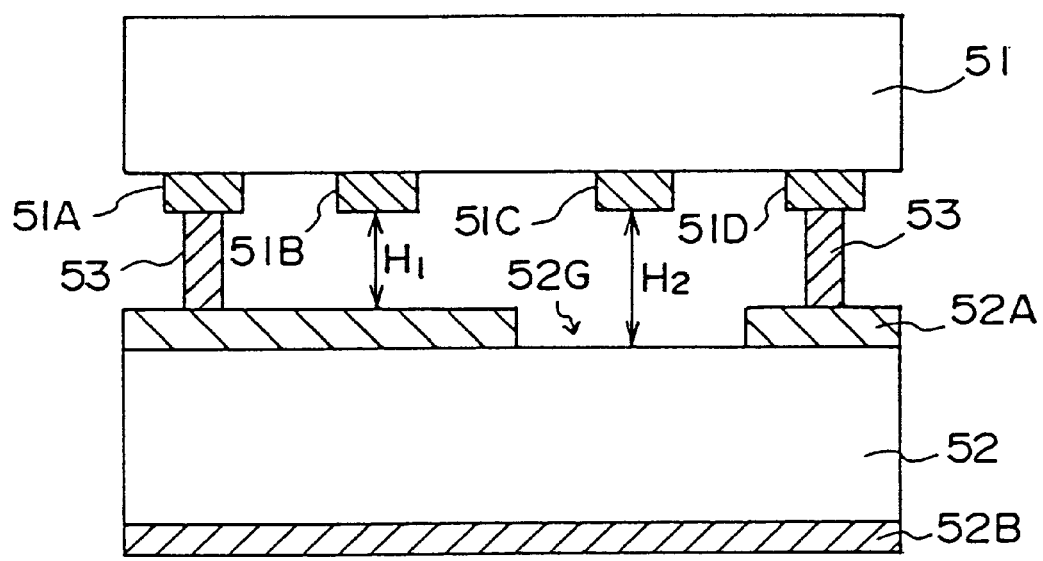
FIG. 9 is a diagram showing the construction of a semiconductor device having a flip-chip structure according to a fourth embodiment of the present invention.

FIG. 9 shows the construction of a flip-chip semiconductor device 50 according to a fourth embodiment of the present invention.

Referring to FIG. 9, the flip-chip semiconductor device 50 includes a semiconductor chip 51 carrying electrode patterns 51A–51D on a bottom principal surface thereof and a substrate 52 carrying a ground pattern 52A on a top principal surface thereof, wherein the semiconductor chip 51 is mounted on the substrate 52 in a state that the electrode patterns 51A–51D face the ground pattern 52A. Thereby, the ground patterns 51A and 51D are connected to the ground pattern 51A electrically as well as mechanically by a solder bump 53.

In the construction of FIG. 9, it should be noted that the conductor pattern 51B carrying the high-frequency signals on the semiconductor chip 51 is held at the distance $H_1$ from the ground pattern 52A and forms a microstrip line having a predetermined impedance value such as 50 Ω. On the other hand, the ground pattern 52A is formed with a cutout 52G exposing the top principal surface of the substrate 52 in correspondence to the power conductor pattern 51C on the semiconductor chip 51. As a result of formation of the cutout 52G, the impedance of the conductor pattern 51C increases with respect to the impedance of the signal conductor pattern 51B because of the increased distance $H_2$ with respect to the distance $H_1$.

In the construction of FIG. 9, it should be noted that the top principal surface of the substrate 52 is exposed at the cutout 52G. In order to avoid the instability associated with such a construction that includes a cutout in the ground pattern 52A on the substrate 52, the semiconductor device 50 of the present embodiment uses another ground electrode 52B on the bottom principal surface of the substrate 22 such that the ground electrode 52B covers substantially the entirety of the bottom principal surface. The ground electrode 52B may be buried inside the substrate 52.

Further, the present invention is not limited to the embodiments described heretofore but various variations and modifications may be made without departing from the scope of the invention.

What is claimed is:

1. A semiconductor device comprising:

a substrate having a first principal surface, said substrate carrying first wiring patterns on a first principal surface;

a semiconductor chip having a second principal surface, said semiconductor chip carrying second wiring patterns on said second principal surface, said semiconductor chip being disposed on said substrate such that said second principal surface faces said first principal surface; and a conductor connecting one of said first wiring patterns and one of said second wiring patterns electrically and mechanically;

said second wiring patterns including a power conductor pattern and at least one other wiring pattern;

wherein said at least one other wiring pattern faces said first principal surface at a predetermined distance, and a distance between said power conductor pattern and said first principal surface, in an area in correspondence to said power conductor pattern where said power conductor pattern is not electrically connected to said first principal surface, is larger than said predetermined distance, said substrate being formed with a groove on said first principal surface thereof in correspondence to said power conductor pattern, said groove extending along said power conductor pattern.

2. A semiconductor device as claimed in claim 1, wherein said semiconductor chip is formed with a depression on said second principal surface thereof in correspondence to said power conductor pattern.

3. A semiconductor device as claimed in claim 1, wherein said first wiring patterns include a ground pattern such that said ground pattern covers a surface of said depression.

4. A semiconductor device as claimed in claim 1, wherein said depression is defined by a tilted side wall, and wherein said ground pattern covers said tilted side wall.

5. A semiconductor device as claimed in claim 1, wherein said first wiring patterns on said substrate include a first ground pattern provided on said first principal surface, said substrate further including another ground pattern substantially parallel to said first principal surface underneath said first wiring pattern, said depression being formed in said first ground pattern so as to expose said another ground pattern.

6. A semiconductor device as claimed in claim 1, wherein said substrate carries a ground pattern on a principal surface opposite to said first principal surface.

7. A semiconductor device as claimed in claim 1, wherein said second wiring patterns include a microstrip line.

* * * * *